United States Patent [19]
Matsumura et al.

[11] Patent Number: 5,240,551
[45] Date of Patent: Aug. 31, 1993

[54] METHOD OF MANUFACTURING CERAMIC CIRCUIT BOARD

[75] Inventors: Kazuo Matsumura, Kawasaki; Tadashi Tanaka, Matsudo; Shoji Tsurutani, Kawasaki, all of Japan

[73] Assignee: Kabushiki Kaisha Toshiba, Kanagawa, Japan

[21] Appl. No.: 770,870

[22] Filed: Oct. 4, 1991

[30] Foreign Application Priority Data

Oct. 5, 1990 [JP] Japan .................................. 2-269221
Oct. 5, 1990 [JP] Japan .................................. 2-269222

[51] Int. Cl.$^5$ ........................... C23F 1/00; B44C 1/22
[52] U.S. Cl. .................................... 156/630; 156/634; 156/651; 156/656; 156/666; 156/901; 428/209; 428/901
[58] Field of Search ............... 156/629, 630, 634, 651, 156/656, 659.1, 666, 901, 902; 29/846; 204/15; 428/209, 901; 174/250, 255, 259

[56] References Cited

U.S. PATENT DOCUMENTS 3,138,503  6/1964  Taraud .................. 156/902 X
3,264,152  8/1966  Haydon ................... 156/630
4,540,462  9/1985  Mizunoya et al. .......... 156/630

FOREIGN PATENT DOCUMENTS 64-4668  1/1989  Japan .

Primary Examiner—William A. Powell
Attorney, Agent, or Firm—Oblon, Spivak, McClelland, Maier & Neustadt

[57] ABSTRACT

A ceramics circuit board is manufactured by preliminarily preparing a circuit pattern base composed of a plurality of circuit pattern elements connected by bridging pieces each having a thickness smaller than that of the circuit pattern element, preferably less than half thickness of the circuit pattern base, applying and bonding the circuit pattern base onto one surface of a ceramics board base and removing the bridging pieces by effecting an etching treatment to thereby form a circuit pattern having a predetermined shape on the one surface of the ceramics board base. The circuit pattern base and the bridging pieces are formed of one metallic plate by partially effecting etching treatment. The bridging pieces are arranged so as to have a gap between a rear surface thereof and the one surface of the ceramics board base when the circuit pattern base is applied on the one surface of the ceramics board base. The bonding step may be carried out by forming, on a surface to be bonded, an eutectic material composed of the same metallic material as that composing the circuit pattern base and oxygen. It is preferred that the method further includes the step of applying and bonding a copper plate to another surface of the ceramics board base before the etching treatment.

10 Claims, 3 Drawing Sheets

METHOD OF MANUFACTURING CERAMIC CIRCUIT BOARD

BACKGROUND OF THE INVENTION

The present invention relates to a method of manufacturing a ceramic circuit board particularly provided with a circuit pattern with highly improved positioning performance and capable of achieving yielding of the circuit boards with high quality.

In the known art of this field, there have been widely utilized ceramic circuit boards, for power transistors, microwave transistors, module structures, hybrid integrated circuit (IC) boards and the like, each in which a metallic circuit plate formed from copper, for example, having a high heat conductivity and high electrical conductivity is bonded to at least one of surfaces of a ceramic insulating plate.

In the known art, such ceramic circuit boards have been manufactured by forming plural kinds of circuit pattern elements by punching out a metallic conductive plate such as copper plate with a punching press, arranging these circuit pattern elements in predetermined positions on the ceramic board base and then integrally bonding them by means of heat bonding, for example. In this manufacturing method, there has been adapted a method, as the bonding step, in which a metallic material and the ceramic board base are directly bonded by forming on a bonding surface an eutectic fused layer formed of the metallic material and oxygen, or in which active metal is diffused in both the ceramic board base and the circuit pattern elements to thereby integrate them with each other.

It is however considerably troublesome to fix the plural circuit pattern elements at their respective predetermined positions on the ceramic board base, resulting in increased working steps, thus being disadvantageous.

In order to obviate the above defect of the prior art, there has been also provided a circuit pattern forming method in which a circuit pattern base including a plurality of circuit pattern elements, which are preliminarily coupled with each other through bridging pieces, is prepared by means of press working. The thus prepared circuit pattern base and a backing copper plate are bonded to the front and back surfaces of the ceramic board base, respectively, and the respective bridging pieces are then cut off by a cutting tool such as rotary cutter, thus forming the circuit pattern having a predetermined shape.

In such conventional method, however, it is difficult to substantially completely remove the respective bridging pieces by using the rotary cutter and burrs or the like remaining unremoved are formed at the bridging piece removed portions. Such burrs may cause an abnormal discharge when the circuit board is utilized and the withstand voltage characteristics of the circuit board is hence largely lowered, thus adversely affecting the reliability of the whole circuit board structure or performance.

In the meantime, since the circuit pattern base in the conventional technique is prepared by the press punching working, large mechanical shock or impact is applied to the circuit pattern base, which results in increased deformation of the circuit pattern base. The deformation of the circuit pattern base further results in inadequate contact with the ceramic board base and, hence, the bonding defects between the ceramics board base and the circuit pattern base occurs with relatively high frequency. Particularly, in these days, since there has been generally adapted a method in which the eutectic fused layer formed of the metallic material and the oxygen is formed on the bonding surface to thereby directly bond the metallic material and the ceramic board base, the defects in bonding working rapidly increase, resulting in substantial reduction of the production of ceramic circuit board products, even in the slight deformation of the circuit pattern base.

Furthermore, in the method in which the circuit pattern base is prepared by the pressing means, since a die pressing apparatus is itself expensive and the punching performance of the pressing apparatus is generally limited to about 1 mm in the minimum width, it is difficult to form a complicated circuit pattern with high density and high performance. Further, increased working costs are incurred.

SUMMARY OF THE INVENTION

An object of the present invention is to substantially eliminate the defects or drawbacks encountered in the prior art described above and to provide a method of preparing a ceramic circuit board capable of manufacturing the ceramic circuit board having a precise circuit pattern arrangement with substantially no deformation or positional displacement of the circuit pattern.

In order to achieve this and other objects, the inventors of the subject application conceived the present invention particularly in consideration of the following matters.

In the repeated tests and examinations of the method for reducing the deformation of the circuit pattern base to effectively form the circuit pattern as the ceramic circuit board with high precision and performance, it was found out that the circuit board with remarkably reduced deformation could be obtained with high reliability by removing the bridging pieces connecting the respective circuit pattern elements by effecting the etching treatment which does not cause mechanical shock or impact.

Namely, the method of manufacturing a ceramics circuit board according to the present invention characterized by comprising the steps of preparing a ceramics board base, preparing a circuit pattern base composed of a plurality of circuit pattern elements connected by bridging pieces each having a thickness smaller than that of the circuit pattern element, applying the circuit pattern base on one surface of the ceramic board base and removing the bridging pieces by an etching treatment to thereby form a circuit pattern having a predetermined shape on one surface of the ceramic board base.

In preferred embodiments, the circuit pattern base and the bridging pieces are formed of one metallic plate by partially effecting etching treatment. A plating may be made on the circuit pattern surface after the etching treatment.

It is desired that the bridging piece has a thickness less than half of the circuit pattern base, and more preferably, a thickness of 0.05 to 0.2 mm regardless of the thickness of the circuit pattern base.

The method may further comprises the steps of preparing a copper plate and applying the copper plate to another surface of the ceramic board base before the etching treatment.

The circuit pattern base composed of a plurality of citcuit pattern elements connected by the bridging pieces may be formed by punching a metallic plate by using a press, but it is preferred to form the circuit pattern base by partially etching one matallic plate. Namely, according to the etching treatment, the deformation of the circuit pattern base can be minimumly reduced without imparting a large impact such as applied by the using of the press and the density of arrangement and the shape performance of the circuit pattern can be highly improved.

After the preparation of the circuit pattern base including the bridging pieces, it is arranged and bonded integrally to the predetermined position of the surface of the ceramic board base formed of alumina ($Al_2O_3$), silicon nitride ($Si_3N_4$), aluminium nitride (AlN), or the like.

As described above, the thus prepared circuit pattern base includes the bridging pieces each having a thickness less than half of the circuit pattern base and adjusted by a so-called a half etching treatment. It is however desired that the bridging piece have a thickness of 0.05 to 0.2 mm. In case of less than 0.05 mm, it is difficult to integrally hold them when the circuit pattern bases are conveyed or moved as well as the difficulty of the formation of the bridging pieces themselves. In case of more than 0.2 mm, it is necessary to effect the etching treatment deeply, requiring much time and labour, resulting in degraded circuit pattern formation.

The backing copper plate having a thickness slightly smaller than that of the circuit pattern base is then applied and bonded to another, i.e. back, surface of the ceramic board base. In this bonding operation, in a case where the circuit pattern base is formed of a copper material, there is adapted a method in which the ceramic board base, the circuit pattern base and the backing copper plate are heated to a temperature (1063° to 1083° C.) at which an eutectic material of copper and oxygen and these bases and plate are mutually integrally bonded as a bonded assembly by the thus generated eutectic material.

The thus formed bonded assembly is effected with the etching treatment, which is carried out by immersing the bonded assembly into a chemical solution, for etching a metallic material and then dissolving and partially removed the same, such as a mixed solution of sulfuric acid and hydrogen peroxide or ferric chloride solution. The etching amount is adjusted in accordance with temperature and concentration of the chemical solution used and the immersing time.

According to this etching treatment, the surface layers of the circuit pattern base and the backing copper plate are etched and then removed, and simultaneously, the front and back surfaces of the bridging pieces are simultaneously etched from both sides and substantially completely removed by the chemical solution for the etching treatment, whereby the respective circuit pattern elements can be independently, with no bridging pieces, formed on the predetermined positions of the surface of the ceramic board base, thus preparing the ceramic circuit board.

According to the present invention, as described above, the bridging pieces connecting the circuit pattern elements are chemically dissolved and removed by the etching treatment, so that the bridging pieces can be substantially completely removed and no burrs are formed in comparison to the mechanical removal of the bridging pieces which frequently results in burr formation. Furthermore, since no mechanical shock or impact is not imparted to the circuit pattern base during the removal of the bridging pieces, the deformation of the circuit pattern can be substantially eliminated, resulting in no generation of bonding defects such as the peeling or swelling of the bonded portion between the circuit pattern base and the ceramic board base, thus remakably improving the yield of the final products of the ceramic circuit boards.

Moreover, according to the present invention in which the abnormal discharging caused mainly by the burrs formed in the mechanical bridging piece removal can be substantially completely eliminated, it can be possible to remarkably improve the withstand voltage characteristics, thus providing the circuit board with high reliablity and quality.

Further, according to the bonding assembly prepared by forming, to the bonding surface, the eutectic fused layer formed of the metallic component and the oxygen and then directly bonding the circuit pattern base to the ceramic board base, a metallic oxide layer having low wettability against soldering is formed on the circuit pattern base surface. This oxide layer has a defect of remarkably lowering the wettability against the soldering. According to the present invention, however, such oxide layer is etched by the etching treatment, the solder wettability is less lowered. Particularly, at the bonding process with a heating temperature of more than 100° C., thin oxide layers are formed on the respective circuit pattern elements by this heating. However, according to the present invention, such oxide layers can be removed by the etching treatment, thus effectively improving the solder wettability and achieving an improved wire bonding performance. Even in a case where the oxide layers remain partially, the solder wettability can be improved by forming a plating layer such as of Ni on the surface of the circuit pattern after the etching treatment, and moreover, the wire bonding performance can be also remarkably improved in a post process.

DESCRIPTION OF THE PREFERRED EMBODIMENT

Figure 5:
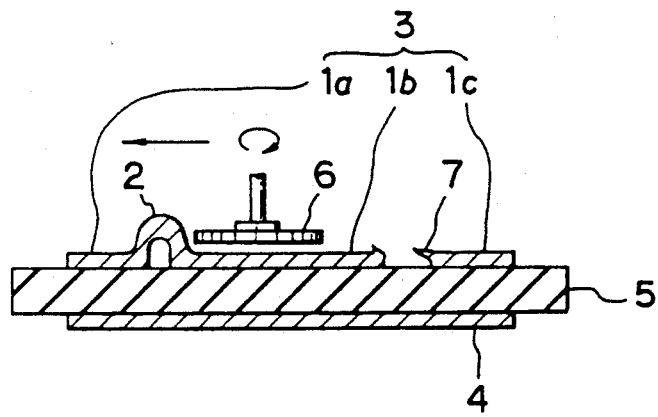
FIG. 5 is a sectional view for the explanation of a conventional ceramic circuit board manufacturing method.

For a better understanding of the present invention, a reference is first made to FIG. 5 which represents one typical example according to the conventional technique.

Referring to FIG. 5, a circuit pattern base 3 comprising a plurality of circuit pattern elements 1a, 1b and 1c which are preliminarily connected with each other through bridging pieces 2 is prepared by means of press working. The thus prepared circuit pattern base 3 and a backing copper plate 4 are bonded to the front and back surfaces of the ceramic board base 5, respectively, and the respective bridging pieces 2 are then cut off by a cutting tool such as rotary cutter 6, thus forming the circuit pattern having a predetermined shape.

In such conventional method, however, as described hereinbefore, it is difficult to substantially completely remove the respective bridging pieces by using the rotary cutter and burrs 7 or the like remaining unremoved are formed at the bridging piece removed portions. Such burrs 7 may cause an abnormal discharge when the circuit board is utilized and the withstand voltage characteristics of the circuit board is hence largely lowered, thus adversely affecting on the reliability of the whole circuit board structure or performance.

The present invention conceived for solving the problems of the prior art will be described hereunder more concretely, by way of preferred embodiments, with reference to FIGS. 1 to 4.

Figure 1:
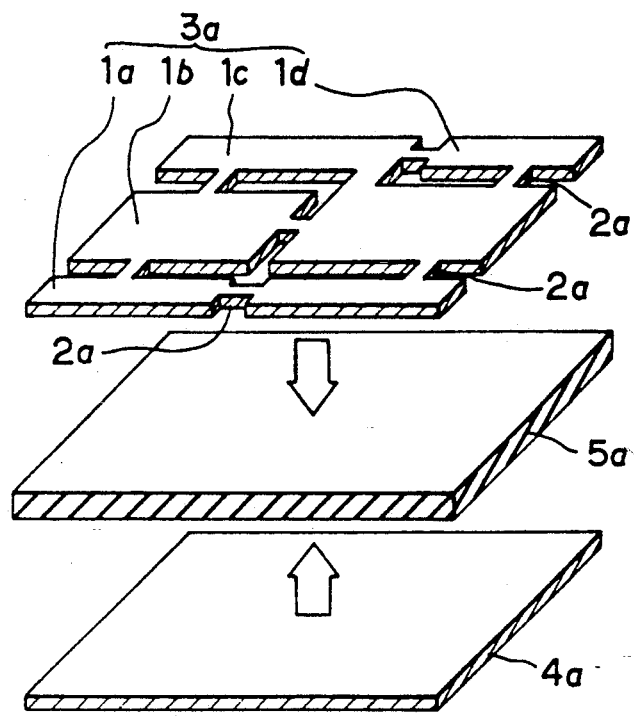
FIG. 1 is a developed perspective view showing constructional elements of a ceramic circuit board before integration by a method according to the present invention.

In one embodiment, in a preliminary stage, as shown in FIG. 1, a plurality of circuit pattern bases 3a each including a plurality of circuit pattern elements 1a, 1b, 1c and 1d (four in the illustration) which are connected through bridging pieces 2a were prepared by effecting an etching treatment to tough pitch electrolytic copper plates each being a rectangular plate containing oxygen of 300 ppm and having an end width of 26 mm, a side width of 60 mm and a thickness of 0.4 mm. A plurality of backing copper plates 4a, each being not effected with the etching treatment and having substantially the same size as that of the circuit pattern base 3a, were also prepared.

Figure 2:
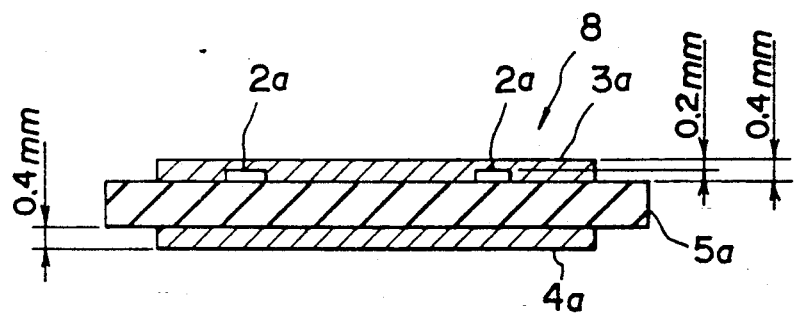
FIG. 2 is a sectional view of an assembly formed by bonding the constructional elements shown in FIG. 1.

In this preparation, each of the bridging pieces 2a was formed by effecting a half-etching treatment to a base material so as to have a thickness half (0.2 m) of that of the circuit pattern base 3a as shown in FIG. 2 so as to have a gap between the lower, as viewed, surface thereof and the upper surface of a ceramic board base 5a mentioned below. In the illustrated embodiment, the upper surfaces of the bridging pieces 2a are flush with the upper surface of the circuit pattern elements 1a to 1d, and accordingly, the gap has a distance of 0.2 mm.

Furthermore, as shown in FIG. 1, a plurality of ceramics board bases 5a, each being essentially made of alumina having a purity of 96% and having an end width of 29 mm, a side width of 63 mm and a thickness of 0.635 mm, were prepared as ceramic board bases.

The circuit pattern base 3a thus prepared was arranged and bonded onto the front, upper as viewed in FIG. 1, surface of the ceramics board base 5a by means of a small amount of a binder, and the backing copper plate 4a was also arranged onto the back surface of the ceramics board base 5a. Thereafter, the thus prepared circuit board assembly was heated with a temperature of 1070° C. in a heating furnace in a nitrogen atmosphere and kept as it is for 5 minutes. Through these processes, an eutectic fused layer was formed and the ceramics board base 5a and the backing copper plate 4a is directly integrally bonded, thereby forming a bonded assembly 8 as shown in FIG. 2.

Figure 3:
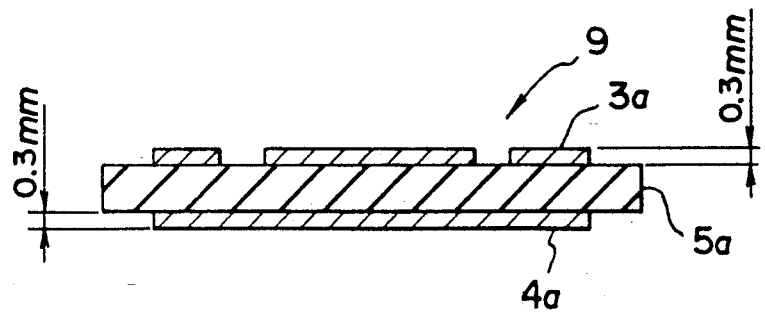
FIG. 3 is a view similar to that of FIG. 2 showing a condition after effecting the etching treatment.
Figure 4:
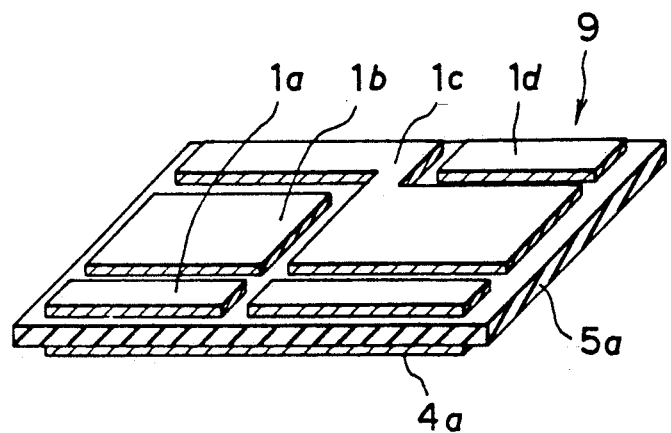
FIG. 4 is a perspective view of the ceramic circuit board prepared by the method according to the present invention.

The thus prepared respective bonded assemblies 8 were etched by immersing them into ferric chloride (FeCl$_3$) solution having concentration of 20 wt % for 20 minutes at a temperature of 26° C. According to this etching treatment, surface layers of both the circuit pattern base 3a and backing copper plate 4a were etched and then partially removed. Namely, in the illustrated embodiment, as described above, the thickness is reduced by 0.1 mm by this etching treatment for removing the bridging pieces 2a. Simultaneously, the front and back, i.e. upper and lower as viewed, surfaces of the respective bridging pieces 2a were also etched by the FeCl$_3$ solution by amounts of 0.1 mm simultaneously on each surface side, thus being completely removed, whereby as shown in FIGS. 3 and 4, a ceramics circuit board 9 was prepared in which the respective circuit pattern elements 1a to 1d were independently arranged at the predetermined positions on the ceramic board plate 5a with no bridging pieces 2a.

It may be possible to effect a plating to the outer surfaces of the thus prepared ceramic circuit board.

On the contrary, as comparative examples, were also prepared by using the die pressing apparatus a plurality of circuit pattern bases each having the same composition, shape and size as those of the circuit pattern base prepared in accordance with the embodiment described above. The ceramic board base and the backing copper plate both being prepared under the same conditions as those prepared in the aforementioned embodiment were directly bonded to the front and back surfaces of the thus prepared ceramic board base, thus preparing a bonded assembly. In the next step, the respective bridging pieces were cut off by the rotary cutter to thereby prepare a conventional ceramic circuit board as comparative example. A plurality of such comparative ceramic circuit boards were prepared.

The thus prepared ceramic circuit boards according to the present invention and the conventional art were tested for the evaluation of the characteristics thereof. The tests were carried out to all the species of the ceramic circuit boards as withstand voltage tests in which 1 Kv/mm voltage was applied between adjacent circuit pattern elements and the presence or absence of generation of abnormal discharging was examined. In these tests, the ratio of the numbers of the species to which the abnormal discharging was caused with respect to all the species was calculated as bonding fraction defective.

Furthermore, all the working processes for manufacturing two thousands (2000) of ceramics circuit boards respectively in accordance with the present embodiment and the conventional art were calculated and the working processes were displayed as an exponential value with the case of the conventional art being a ratio of 100. All the working processes include the preparation processes for preparing the circuit pattern bases by the etching treatments and the die pressing steps, the bonding processes, the etching processes, the bridging piece removing processes, the inspecting processes for sizes or the like of the products and the examining processes based on the withstand voltage tests. The evaluations made on the basis of the above tests are represented by the following table 1.

TABLE 1

| Species | Withstand Voltage Characteristics Fraction Defective (%) | Bonding Fraction Defective (%) | Final Yield of Products | Manufacturing Processes (%) |
| --- | --- | --- | --- | --- |
| Embodiment | 0 | 0 | 99 | 70 |
| Comparative Example | 5 | 5 | 87 | 100 |

As can be seen from the above table 1, since the ceramic circuit boards according to the present embodiment includes the bridging pieces which are chemically dissolved and removed by the etching treatment, the bridging pieces can be substantially completely removed and no burr is substantially generated in comparison with mechanical removal of the bridging pieces as in the comparative example according to the conventional art, thus providing the superior withstand voltage characteristics. Furthermore, since no mechanical shock or impact is imparted to the circuit pattern base during the removal of the bridging pieces, the deformation of the circuit pattern base can be substantially eliminated, resulting in no generation of bonding defects such as the peeling or swelling of the bonded portion between the circuit pattern base and the ceramic board base, thus remakably improving the yield of the final ceramic circuit board products.

Moreover, according to the present invention in which the abnormal discharging caused mainly by the burrs formed in the mechanical bridging piece removal can be substantially completely eliminated, it may be possible to eliminate the withstand voltage tests, thus reducing the total numbers of the working processes by amount of about 30% in comparison with the conventional technique. Since the circuit pattern base and the bridging pieces are formed by the etching treatment, the deformation of the circuit pattern base can be significantly reduced, thus improving the bonding strength, and in addition, a complicated circuit pattern base having a small pattern width or gap can be manufactured with an improved performance in comparison with the conventional method utilizing the die pressing apparatus.

Further, according to the bonding assembly prepared by forming, to the bonding surface, the eutectic fused layer formed of the metallic component and the oxygen and then directly bonding the circuit pattern base to the ceramic board base, a metallic oxide layer having low wettability against soldering is formed on the circuit patter base surface. According to the present invention, however, such metallic oxide layer is etched by the etching treatment, the solder wettability is less lowered, and hence, the ceramic circuit board having a superior wire bonding property can be obtained.

Although in the described embodiment, the backing copper plate is bonded to the back surface of the ceramics board base, the backing copper plate may be eliminated in a case where a bimetallic effect to the ceramic circuit board is not considered.

Figure 2A:
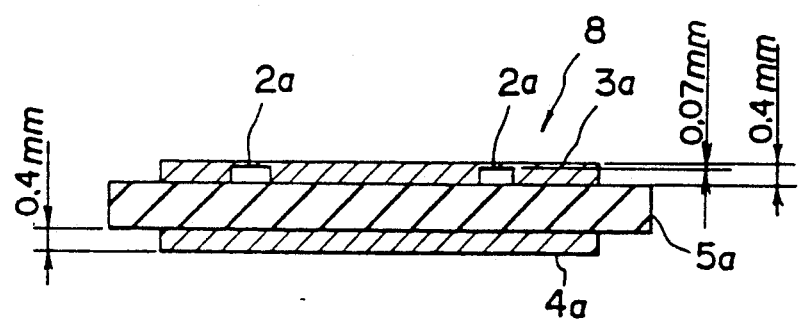
FIG. 2A is a sectional view similar to FIG. 2 according to another embodiment of the present invention.

In another embodiment, a ceramic circuit board 9 was manufactured, which has substantially the same circuit pattern base as that in the aforementioned embodiment except for the bridging pieces each having a thickness of 0.07 mm, as shown in FIG. 2A. In this embodiment, the time spent for the etching treatment was largely reduced to about 1.5 minutes, whereas the time for the aforementioned embodiment was about 4.0 minutes. Moreover, the circuit pattern formed according to this embodiment provided a good shape.

What is claimed is:

1. A method of manufacturing a ceramic circuit board in which a metallic circuit pattern is integrally bonded onto a ceramic board base by a heat treatment, the method comprising the steps of:

preparing a ceramic board base;

preparing a circuit pattern base composed of a plurality of circuit pattern elements connected by bridging pieces each having a thickness smaller than the thickness of the circuit pattern element, wherein said bridging pieces are arranged so as to leave gaps between the rear surface of each piece and the surface of the ceramic board base which comes into contact with the circuit pattern base, when the contact pattern base is applied onto a surface of the ceramic board base;

applying and bonding the circuit pattern base onto said surface of the ceramic board base; and removing the bridging pieces by an etching treatment thereby forming a circuit pattern having a predetermined shape on one surface of the ceramic board base.

2. A method according to claim 1 wherein the thickness of each of the bridging pieces is less than half the thickness of the circuit pattern base.

3. A method according to claim 2, wherein the thickness of each of the bridging pieces is about 0.05 to 0.2 mm.

4. A method according to claim 1, wherein said circuit pattern base and said bridging pieces are formed of one metallic plate by partially effecting etching treatment.

5. A method according to claim 1, wherein said bridging pieces are arranged so as to leave gaps between the rear surfaces thereof and a surface of the ceramic board base when the circuit pattern base is applied onto a surface of the ceramic board base.

6. A method according to claim 1, wherein the bonding step is carried out by forming, on a surface to be bonded, a eutectic material composed of the same metallic material as that which comprises the circuit pattern base and oxygen.

7. A method according to claim 1, further comprising the step of plating the surface of the circuit pattern after the etching treatment.

8. A method according to claim 1 further comprising the steps of preparing a copper plate and applying the copper plate the remaining surface of the ceramic board base before the etching treatment.

9. A method according to claim 8, wherein the metallic material which comprises the circuit pattern base is copper.

10. A ceramic circuit board manufactured by the method according to claim 1.

* * * * *